United States Patent [19]

Brych

[11] 3,961,253

[45] June 1, 1976

[54] ELECTRICAL VOLTAGE INDICATING DEVICE

[75] Inventor: Alfred Brych, Chasseneuil-du-Poitou, France

[73] Assignee: Saft-Societe des Accumulateurs Fixes et de Traction, Romainville, France

[22] Filed: Oct. 3, 1974

[21] Appl. No.: 511,672

[30] Foreign Application Priority Data
Oct. 16, 1973  France ............................. 73.36810

[52] U.S. Cl............................ 324/94; 252/188.3 CL; 313/358
[51] Int. Cl.².......................................... G01R 27/22
[58] Field of Search....................: 324/94; 313/358; 204/62; 252/188.3 CL

[56] References Cited
UNITED STATES PATENTS

| | | | |
|---|---|---|---|
| 2,910,647 | 10/1959 | Kreitsek et al........................ | 324/94 |
| 2,910,648 | 10/1959 | Keller ................................... | 324/94 |
| 3,045,179 | 7/1962 | Maier................................... | 324/94 X |
| 3,403,296 | 9/1968 | Zweig ............................... | 313/358 X |
| 3,530,045 | 9/1970 | Alburger............................ | 324/94 X |
| 3,654,525 | 4/1972 | Maricle et al....................... | 313/358 |
| 3,868,534 | 2/1975 | Pighin et al......................... | 313/358 |

Primary Examiner—Saxfield Chatmon, Jr.
Attorney, Agent, or Firm—Kenyon & Kenyon Reilly Carr & Chapin

[57] ABSTRACT

Electrical voltage indicating device for use in the low-voltage range, characterized in that it comprises at least one electrochemiluminescence cell containing at least two electrodes immersed in an electrolyte containing at least one electrochemical substance whose luminescent excitation threshold value corresponds to the value of a voltage to be monitored. The use of several such substances each having a different luminescent excitation threshold in the same cell or of several cells, each with a substance of different excitation threshold value connected in parallel makes it possible to monitor several different voltage values with the device.

7 Claims, 4 Drawing Figures

B — VOLTAGE TO BE MEASURED PLUS POTENTIOMETRIC CIRCUIT IF NEEDED

ELECTRICAL VOLTAGE INDICATING DEVICE

BRIEF SUMMARY OF INVENTION

The present invention relates to an electrical voltage indicating device for use in the low-voltage range.

An object of the invention is to provide a cheap and small-size device enabling even a not very skilled user to monitor easily a voltage at the terminals of a variable voltage alternating current or of a direct current source, both of the order of a few volts or of a few tenths of volts.

The present invention also has among its objects an electrical voltage indicating device based on the utilization of electrochemiluminescence phenomena. It is known when a given voltage is applied under certain prescribed conditions to two inert electroes immersed in a non-aqueous electrolyte containing certain dissolved substances an emission of a light radiation of specific colour results which lasts the entire time that the voltage is applied. The wavelength of the radiation and the minimum value of the voltage to be applied to the electrodes to obtain the emission are specific to the particular substances contained in the electrolyte. An electrical voltage indicating device according to the invention is characterized in that it comprises at least one electrochemiluminescence cell comprising two electrodes immersed in an electrolyte containing at least one substance in which the value of the luminescence excitation threshold corresponds to the value of a voltage to be detected.

The device according to the invention also comprises, to great advantage, a potentiometric circuit connected with the said electrochemiluminescent cell for use particularly where the voltage of the source whose voltage is to be monitored is greater than the threshold excitation voltage of the luminescent substance in the cell.

According to a first embodiment, the said cell contains a single electrochemiluminescent substance. When the device is connected to the terminals of a voltage source, the appearance of a luminescent radiation makes it possible to detect the moment when the increasing voltage passes through the excitation threshold value of the said substance; conversely, extinguishment of the luminescence makes it possible to detect the moment when the decreasing voltage passes reversely through that threshold value. Moreover, the intensity of the luminescent radiation which increases with the applied voltage makes it possible, to a certain extent, to appreciate the value of that voltage in relation to that of the excitation threshold.

According to an improved embodiment, the said cell contains at least two different electrochemiluminescent substances whose emission wavelengths and excitation thresholds are different. A calibration of the colour of the resulting radiation gives, in this case, an indication about the valve of the tested voltage in relation to the various excitation voltages of the substance contained in the cell.

By way of an example, it is assumed hereinafter that the tested voltage is constantly increasing.

When the said voltage reaches the excitation threshold of the substance which has the lowest threshold, the cell emits a luminescent radiation whose wavelength is inherent to that substance.

When the said voltage reaches the excitation threshold of the substance whose excitation threshold occurs after the first one in increasing values, the cell emits a radiation which is a combination of the two luminescent radiations of the excited substances, and whose colour results from the mixture of the two different colours of the two radiations. As the said voltage increases, that resultant colour, however, varies according to the relative intensities of the two luminescent radiations. When the said voltage reaches the excitation threshold of a further substance of still higher threshold, the mixture of the colours is again modified and so on.

In such case, a direct comparison between the colour of the cell and a range of calibrated colours makes it possible to calculate the value of the said measured voltage and to follow the variations thereof.

According to another embodiment, a device according to the invention comprises several electrochemiluminescent cells connected up in parallel, respectively, containing substances having different excitation thresholds and possibly different emission wavelengths. The successive lighting up and extinguishment of the various cells makes it possible also to determine the voltage which is simultaneously applied to them, in a range of known values. The accuracy of the detection will increase with the number of cells used.

The invention will be better understood by reference to the following description together with the accompanying drawing given by way of illustration but having no limiting character and in which:

FIG. 1 is a diagrammatic front view, very much enlarged, of an example of an electrochemiluminescent cell according to the invention, FIG. 2 is a diagrammatic perspective partial view, very much enlarged, of a further embodiment of the invention, and FIG. 3 is a wiring diagram of another embodiment of this invention, and FIG. 4 is a wiring diagram of still another embodiment of the invention.

DETAILED DESCRIPTION

Figure 1:
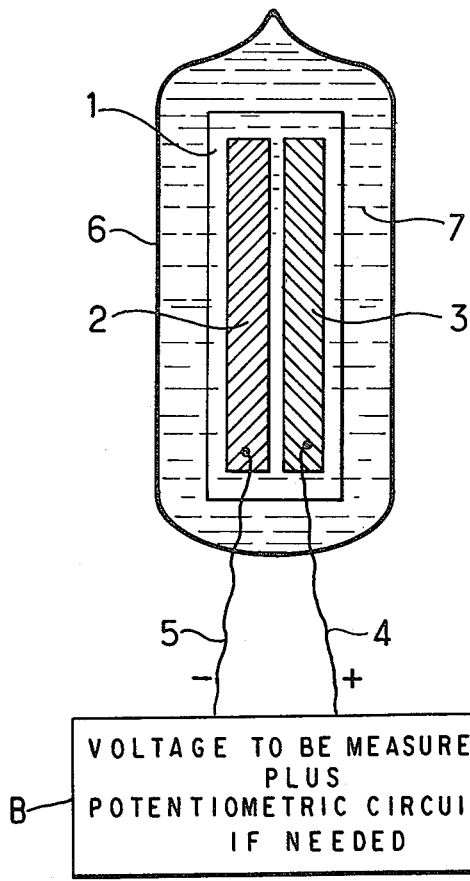
Figure 2:
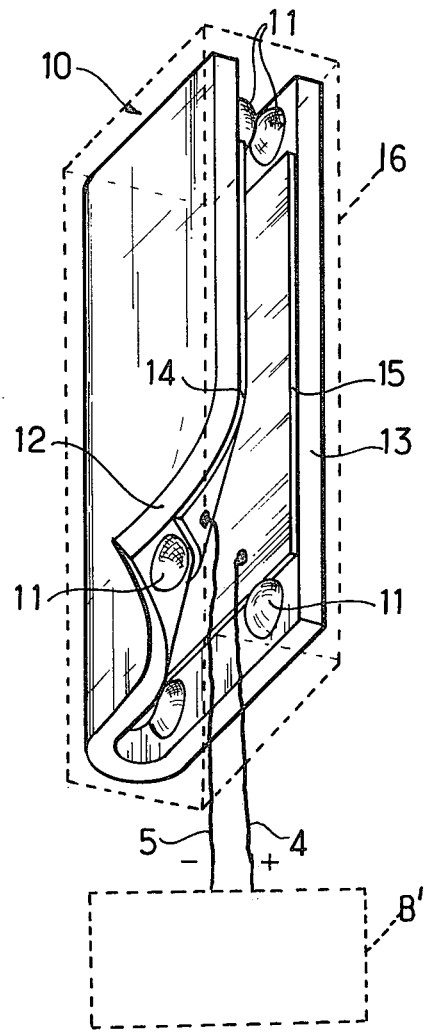

The two cells illustrated in FIGS. 1 and 2 are intended, for example, for detecting a direct current voltage which is liable to vary between 4.5 and 2.7 volts approximately; this may be the range of discharge voltages of a primary battery B.

The cell in FIG. 1 comprises a sealed ampule 6 of transparent or translucent material filled with electrolyte 7 containing one or several electrochemiluminescent substances. An insulative support 1 which cannot be attacked by the electrolyte 7 and on which are fixed two electrodes 2 and 3, separated from each other by about 0.3 mm is arranged so that said electrodes are immersed in that electrolyte in any known way. The distance between the electrodes cannot exceed 0.5 mm, if the voltage to be detected is a direct current voltage. The electrodes 2 and 3 are, to great advantage, constituted by two conductive strips deposited on the support 1 by methods similar to those used for making printed circuits. The electrodes 2 and 3 are respectively soldered to two connection wires 4 and 5 passing through the walls of ampule 6 and are made of a material which cannot be attacked by the electrolyte 7.

The materials of the electrodes 2 and 3 also must be such that they cannot be attacked by the electrolyte; moreover, the material of the positive electrode 3 must withstand oxidization and the material of the negative electrode 2 must withstand reduction.

The cell illustrated partly in FIG. 2 contains an insulative support 10 made of plastic material folded over so as to form two faces 12 and 13 arranged facing each other and on which are respectively fixed the electrodes 14 and 15. Two separate supports adequately connected together could also be used, for each of said electrodes. The distance between the electrodes is defined by bosses 11 formed respectively on the faces 12 and 13. An overall sealed enclosure 16 of material similar to that of ampule 6 and containing these elements and the electrolyte with added electrochemiluminescent substance or substances is provided.

Such an arrangement makes it possible to increase the active volume, examination of the emitted radiation being made along the open edge of the support 10 within said enclosure 16.

Examples of materials used in the two cells which have just been described are as follows:

The respective electrodes 2, 3, 14 and 15 and connections 4, 5, 4', 5' are made of silver or stainless steel. The substance carrying electrolyte is constituted by a solution of tetrabutylammonium perchlorate and 1.2 dimethoxyethane.

The electrochemiluminescent substance included in the electrolyte of either cell may be selected from the group consisting of 9.10 diphenylanthracene whose emission threshold for a blue-violet radiation is 3.2 volts, or naphtacene whose emission threshold for a green radiation is 2.7 volts, or even, rubrene whose emission threshold for an orange radiation is 2.5 volts.

According to a first embodiment, a cell containing one of the said three electrochemiluminescent substances listed above may be used for testing the discharge of the above-mentioned 4.5 volt battery; and accordingly, it will be possible, depending on the substance used to determine whether the voltage of the battery is or is not respectively below 3.2 volts, 2.7 volts or 2.5 volts.

Figure 3:
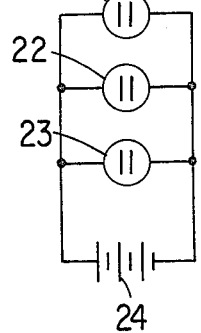

According to a second embodiment illustrated in FIG. 3, three cells 21, 22, 23 respectively containing a different one of the three different electrochemiluminescent substances listed above are connected in parallel and to the battery 24 to be tested. In such case, the device according to the invention will make it possible to indicate the successive passes of the battery voltage through three well-defined values.

According to a third embodiment, a single cell containing all three of said electrochemiluminescent substances listed above within its electrolyte is provided and connected across the battery terminals or other voltages to be detected. During the discharge of the battery, the radiation emitted by the mixture in such cell turns from blue-green to orange, the latter colour becoming clearer and clearer. The colour of the mixture is, to great advantage, compared with a range of colours calibrated for voltage.

It must be understood that the invention is not limited to the embodiments and applications described and illustrated.

Thus, for the monitoring of alternating current voltages, the cells described above may also be suitable; however, their design may be simplified, for the radiation is emitted in the vicinity of the electrodes without it being necessary for these latter to be as close together as in the case of detection of a direct current voltage.

Figure 4:
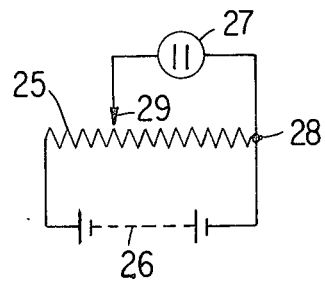

It must be understood that if the voltages to be monitored are higher than the threshold voltages of the electrochemiluminescent substances, the device according to the invention comprises, in additon, a potentiometric circuitry illustrated in FIG. 4. A potentiometer 25 is connected across the voltage to be measured which in this case is that of a battery 26. A test cell is connected between one end 28 and the intermediate point 29 of potentiometer 25 to receive a fraction of the battery voltage. Thus, the said circuitry applies an adequate fraction of the voltage to be measured to the terminals of the said cell or cells. The assembly of the potentiometric circuitry and test cells connected thereto or test cells themselves may be permanently connected to the terminals of the battery or voltage to be tested, for their power consumption is very low.

An application which is a particular advantage may be found for a voltage testing device according to the invention in appliances using batteries (such as wireless sets, for example, wherein an indicator light derived from the test device connected to the battery energizing the appliance may be combined with a colour calibrating scale to indicate the state of charge of the battery energizing the appliance.

In the electrolyte above mentioned, the concentration of tetrabutylammonium perchlorate in dimethoxyethane is about 0.3 M.

Other suitable electrolytes, such as a solution of tetrabutylammonium perchlorate in tetrahydrofuran, may, for example, be used in the same range of concentrations.

The concentrations of electrochemiluminescent substances added to such electrolytes are in the range of from $10^{-4}$ M to $10^{-2}$ M, the preferred concentrations being:

| | |
|---|---|
| 9.10 diphenylanthracene | $2.10^{-3}$ M to $6.10^{-3}$ M |
| naphtacene | $5.10^{-3}$ M |
| rubrene | $2.10^{-3}$ M to $5.10^{-3}$ M |

Other suitable electrochemiluminescent substances such as 1, 3, 6, 8 tetraphenylpyrene may be used.

While specific embodiments of the invention have been described, variations within the scope of the appended claims are possible and are contemplated. There is no intention, therefore, of limitatin to the exact disclosure herein presented.

What is claimed is:

1. Electrical voltage indicating device for d.c. voltages comprising at least one electrochemiluminescent cell, said cell containing a non-aqueous electrolyte and solvent, at least one electrochemiluminescent substance whose excitation threshold has a value that corresponds to the value of a voltage to be detected and indicated, a pair of electrodes in said cell immersed in said electrolyte and spaced apart not greater than 0.5 mm, and means for connecting said electrodes to the d.c. voltage to be detected and indicated.

2. Electrical voltage indicating device according to claim 1, characterized in that said means also comprises potentiometric circuitry connected to and co-operating with the said cell and voltage to be detected and indicated.

3. Electrical voltage indicating device according to claim 1, characterized in that it comprises a single cell containing in said electrolytic solution several electrochemiluminescent substances having different excitation thresholds and emission wavelengths, the colour of the resulting radiation being calibrated for voltage.

4. Electrical voltage indicating device according to claim 1 characterized in that it comprises several electrochemiluminescent cells connected in parallel and containing respectively electrochemiluminescent substances having respective different excitation thresholds corresponding to the said voltages to be detected and indicated.

5. Electrical voltage indicating device according to claim 4, characterized in that the said electrochemiluminescent substances have different emission wavelengths.

6. Electrical voltage indicating device according to claim 1, characterized in that the said electrochemiluminescent substance in said electrolyte and solvent is selected from the group consisting of 9.10 diphenylanthracene, naphtacene and rubrene.

7. Device according to claim 6, characterized in that the said electrolyte and solvent are tetrabutylammonium perchlorate in 1.2 dimethoxyethane.

* * * * *